United States Patent [19]

Ichihashi et al.

[11] Patent Number: 4,670,652
[45] Date of Patent: Jun. 2, 1987

[54] CHARGED PARTICLE BEAM MICROPROBE APPARATUS

[75] Inventors: Mikio Ichihashi, Kodaira; Masahide Okumura, Sagamihara; Satoru Fukuhara, Kokubunji, both of Japan

[73] Assignee: Hitachi, Ltd., Tokyo, Japan

[21] Appl. No.: 737,478

[22] Filed: May 24, 1985

[30] Foreign Application Priority Data

May 25, 1984 [JP] Japan ................................. 59-104533

[51] Int. Cl.⁴ ............................................ H01J 37/28
[52] U.S. Cl. ..................................... 250/310; 250/397
[58] Field of Search ................................ 250/310, 397

[56] References Cited

U.S. PATENT DOCUMENTS 3,329,813  7/1967  Hashimoto ........................... 250/310

Primary Examiner—Bruce C. Anderson
Assistant Examiner—Jack I. Berman
Attorney, Agent, or Firm—Antonelli, Terry & Wands

[57] ABSTRACT

A charged particle beam microprobe apparatus capable of accurately determining the three-dimensional structure of a surface is disclosed in which a detection system including at least a pair of detectors disposed symmetrically with respect to the optical axis of an charged particle beam generating instrument is used for obtaining an image signal from a surface scanned with a charged particle beam, the image signal obtained by difference detection in the detection system is compared with a pair of variable reference levels opposite in polarity to each other, to be converted into positive and negative rectangular wave signals, and information on whether the scanned surface slopes upward or downward when viewed from the detection system and information on the gradient of the scanned surface are obtained from the polarity and pulse width of each of the positive and negative rectangular wave signals, respectively, to determine the three-dimensional structure of the scanned surface. That is, the charged particle beam apparatus does not utilize a phenomenon that the coefficient of backscattered electrons is proportional to the angle of slope of a primary beam impinging surface, and hence can use secondary electron suitable for forming a high resolution scanned image.

2 Claims, 15 Drawing Figures

CHARGED PARTICLE BEAM MICROPROBE APPARATUS

BACKGROUND OF THE INVENTION

The present invention relates to a charged particle beam microprobe apparatus for forming the scanned image of a sample by scanning the sample with an electron beam or an ion beam, and more particularly to a charged particle beam microprobe apparatus suitable for extracting three-dimensional information as to the configuration of a particle beam irradiated surface of a sample from an image signal of the surface.

In recent years, an apparatus has been put to practical use which can measure small dimensions on an electron beam scanned surface from the scanned image or image signal thereof, by utilizing the high resolving power of a scanning electron microscope.

The contrast of a scanned image is caused by the fact that the yields of secondary or backscattered electrons from a surface varies with the material forming the surface and the angle of slope thereof. Accordingly, in order to measure the dimensions of the surface, it is necessary to relate bright and dark parts of the scanned image of the surface with the three-dimensional configuration thereof. FIGS. 1A to 1C show an example of a cross-sectional surface structure and scanned images corresponding thereto. Referring to FIG. 1A which is a cross sectional view of a surface to be measured, the so-called line-and-space pattern is formed by providing a line pattern L on a thin layer S which is formed on a substrate, and hence the to-be-measured surface is made of two kinds of materials. FIG. 1B shows a scanned image for a case when the line pattern L and the thin layer S are made of a photoresist material and $SiO_2$, respectively, and FIG. 1C shows a scanned image for a case where the line pattern L and the thin layer S are made of $Si_3N_4$ and $SiO_2$, respectively. As can be seen from FIGS. 1A to 1C, in order to measure the line width or space width, it is necessary to know whether bright and dark parts of the scanned image correspond to the line pattern L and thin layer S, respectively, or correspond to the thin layer S and line pattern L, respectively. In a case where the dimensions on a surface having a fine structure are to be measured with high accuracy and moreover are automatically measured without utilizing human judgment based upon visual observation of the scanned image, it is very important to determine the three-dimensional structure of the surface.

There has been proposed a method of determining the shape of the cross section of a sample by integrating a signal of backscattered electrons from a surface, under a condition that the coefficient of backscattered electrons is proportional to the angle of slope of the surface, that is, the incident angle of the primary beam to the surface (Refer to a Japanese patent application specification Laid-open No. 150303/81). However, this method is applicable only for a case where the surface is made of a single material and the angle of slope of each part of the surface lies in an angular range in which the above proportionality holds. In the surface of FIG. 1A, which is made of two materials, however, the proportional constant varies with the materials, and hence different integral constants have to be used for different materials, in the integration of the backscattered electron signal. Thus, the above method encounters problems in that it is difficult to determine a boundary between the two materials where one of the integral constants is to be changed over to the other integral constant, and when at least one of the materials is unknown, a corresponding integral constant cannot be determined.

SUMMARY OF THE INVENTION

An object of the present invention is to provide a charged particle beam microprobe apparatus which can practically solve the above problems of the prior art, and can extract information on the three-dimensional structure of a particle beam irradiated surface of a sample from a two-dimensional image signal for forming the scanned image of the above surface.

In order to attain the above object, according to the present invention, there is provided a charged particle beam microprobe apparatus, in which a detection system including at least a pair of detectors disposed symmetrically with respect to the optical axis of a charged particle beam instrument is used for obtaining an image signal from a surface scanned with a charged particle beam, the image signal obtained by difference detection in the detection system is compared with reference levels opposite in polarity to each other, to be adjustable, and converted into positive and negative rectangular wave signals. Information on whether the scanned surface slopes upward or downward when viewed from the detection system and information on the gradient of the scanned surface are obtained from the polarity and pulse width of each of the positive and negative rectangular wave signals, respectively, to determine the three-dimensional configuration of the scanned surface. As can be seen from the above fundamental operation, the present invention does not utilize a phenomenon that the coefficient of backscattered electrons is proportional to the incidence angle of a primary beam to a surface, and thus it is possible to use secondary electrons suitable for forming a high resolution image. Further, the present invention can solve the problem of the prior art caused by the coexistence of different materials in the scanned surface, and can remove the restriction to the angle of slope of each part of the sample surface caused by utilizing the phenomenon that the coefficient of reflected electrons is proportional to the angle of slope of a sample surface.

DESCRIPTION OF THE PREFERRED EMBODIMENT

The present invention will be explained below in detail, on the basis of an embodiment thereof.

Figure 1A:
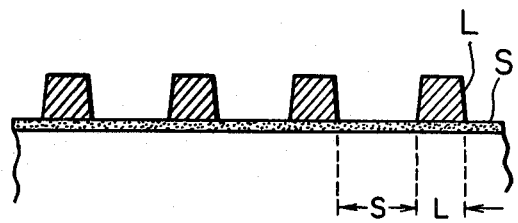
FIG. 1A is a cross sectional view showing a line-and-space pattern made of two kinds of materials.
Figure 1B:
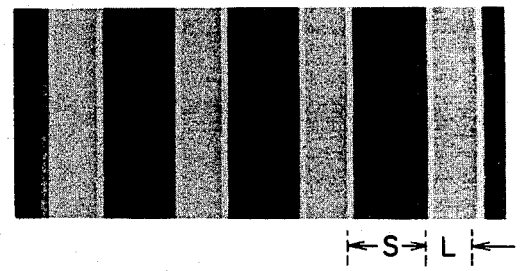
FIGS. 1B and 1C are scanning micrographs of the pattern of FIG. 1A which are obtained by a scanning electron microscope.
Figure 1C:
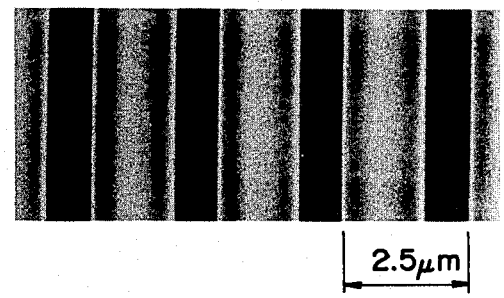
Figure 2:
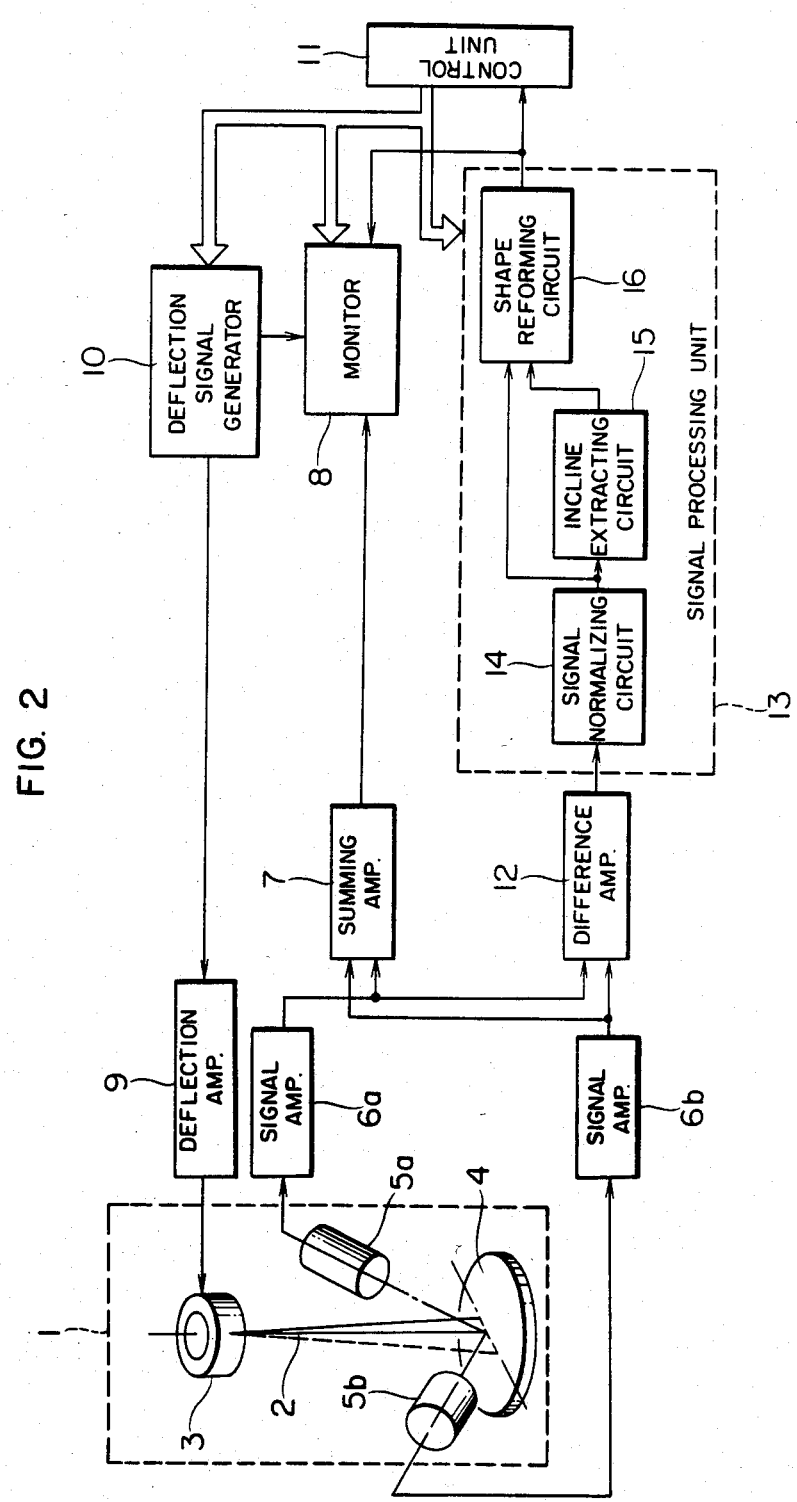
FIG. 2 is a block diagram showing an embodiment of a charged particle beam microprobe apparatus according to the present invention.

FIG. 2 is a block diagram showing the construction of an embodiment of a charged particle beam microprobe apparatus according to the present invention which embodiment uses a scanning electron microscope. Referring to FIG. 2, in an electron optical column 1, an electron beam 2 which is focussed by an electron gun and electron lenses (not shown), is deflected by a deflector 3 so that a sample 4 is scanned one-dimensionally or two-dimensionally with the electron beam 2. Image signals due to the secondary or backscattered electrons from the sample 4 are detected by a pair of detectors 5a and 5b which are disposed along a scanning direction, symmetrically with respect to the optical axis of the electron optical column 1. Further, another pair of detectors (not shown) are disposed along a direction perpendicular to the above direction, symmetrically with respect to the above optical axis. The image signals from the detectors 5a and 5b are amplified by signal amplifiers 6a and 6b, respectively, to a predetermined level, and then applied to a summing amplifier 7, to use the output signal thereof as a brightness modulation signal of a monitor 8. A deflection current from a deflection signal generator 10 is amplified by a deflection amplifier 9, and then supplied to the deflector 3 to cause the electron beam 2 to perform a scanning operation. Further, a deflection signal synchronized with the scanning operation of the electron beam 2 is supplied from the deflection signal generator 10 to the monitor 8, to display the scanned image of the sample 4 on the monitor 8. A scanning electron microscope performs the above-mentioned operation. Now, a method of detecting the uneven structure of the scanned surface of the sample 4 according to the present invention will be explained below. The image signals from the detectors 5a and 5b are applied to a difference amplifier 12 through the signal amplifiers 6a and 6b, to obtain a difference signal, which is converted by a signal processing unit 13 into a shape signal corresponding to a cross section of the sample 4. The signal processing unit 13 includes a signal normalizing circuit 14 for comparing the difference signal with reference levels to deliver positive and negative rectangular wave signals, an incline extracting circuit 15 for obtaining information on whether the scanned surface of the sample slopes upward or downward when viewed from the detectors and information on the gradient (namely, degree of incline) of the scanned surface from the polarity and pulse width of each rectangular wave signal, and a shape reforming circuit 16 for reconstructing the uneven structure of the scanned surface on the basis of the information on whether the scanned surface slopes upward or downward and the information on the incline of the scanned surface. Further, a write-in operation for storing the information on whether the scanned surface slopes upward or downward and the information on the incline of the scanned surface and a read-out operation for reconstructing the uneven structure of the scanned surface from the above information and for displaying the reconstructed structure on the monitor 8, are alternately performed by the signal processing unit 13, on the basis of a control signal from a control unit 11. In the above, explanation has been made of the fundamental operation and the whole construction of the present embodiment.

Figure 3:
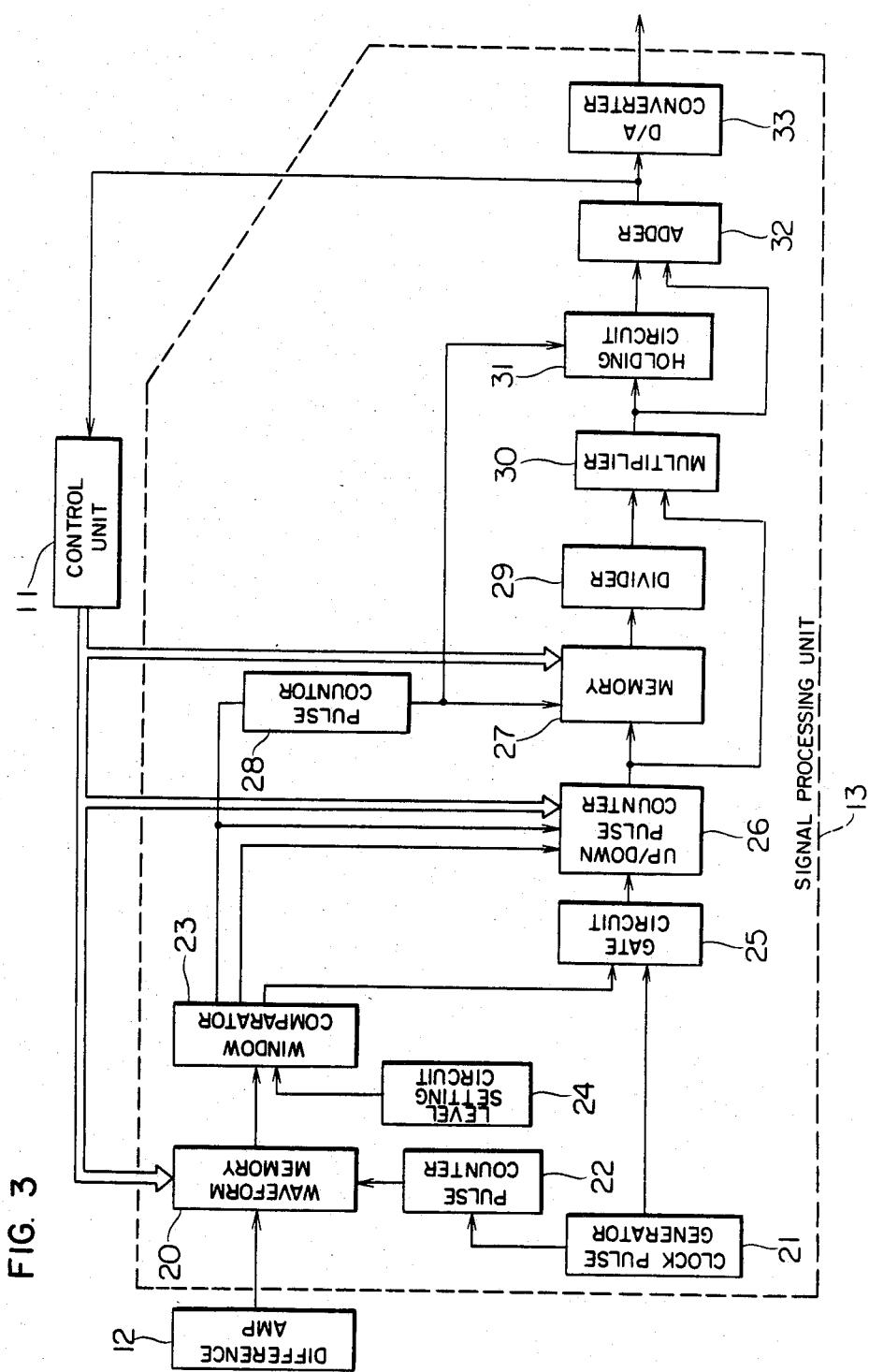
FIG. 3 is a block diagram showing a circuit configuration of the signal processing unit of FIG. 2.
Figure 4A:
FIGS. 4A to 4J are waveform charts for explaining signals which are delivered from various parts of the embodiment of FIG. 2.
Figure 4B:
Figure 4C:
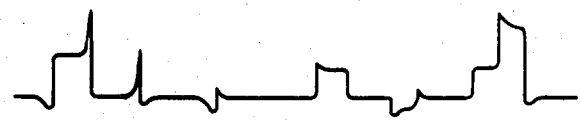
Figure 4D:
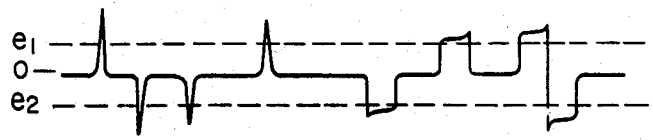
Figure 4E:

FIG. 3 shows an example of the circuit configuration of the signal processing unit 13. The operation of the signal processing unit 13 having the circuit configuration of FIG. 3 will be explained in detail, with reference to waveforms shown in FIGS. 4A to 4J. Let us consider a case where the scanned surface of the sample is made of two kinds of materials A and B and has a fine structure as shown in FIG. 4A, by way of example. The signal yield of the scanned surface is dependent on the elements thereof and the incident angle of the electron beam 2 to the scanned surface (that is, to the fine structure of the scanned surface). Now, let us suppose that the signal yield of the material A is greater than that of the material B. FIGS. 4B and 4C show image signals from the signal amplifiers 6a and 6b, respectively. As can be seen from FIGS. 4B and 4C, the detection efficiency of each of the detectors 5a and 5b is dependent upon not only the signal yield of the scanned surface but also a positional relation between the fine structure of the scanned surface and each detector. In more detail, the detection efficiency of the detector 5a or 5b is large when the detector confronts an electron impinging region of the fine structure, and is small when the detector exists in the rear of the above electron impinging region. The difference signal from the difference amplifier 12 is indicated by a solid line in FIG. 4D. As can be seen from FIGS. 4B to 4D, the intensity change of one image signal caused by the difference in materials making up the scanned surface and the intensity change of the other image signal caused by the above difference cancel each other by difference amplification, and the difference signal contains only peaks due to a difference in detection efficiency between the detectors 5a and 5b at sloped parts of the scanned surface. That is, the zero level of the difference signal corresponds to horizontal portions of a fine pattern indicative of the uneven structure of the scanned surface, independently of materials making the scanned surface.

Figure 4F:
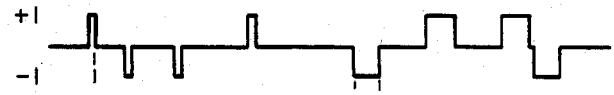
Figure 4G:
Figure 4H:
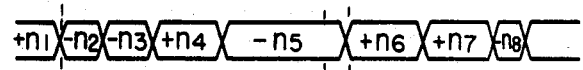

The write-in operation of the signal processing unit 13 will first be explained. The waveform of the difference signal (shown in FIG. 4D) is written in a waveform memory 20 which is addressed by the output of a pulse counter 22 for counting clock pulses (shown in FIG. 4E) from a clock pulse generator 21. Simultaneously with the writing of the difference signal in the waveform memory 20, the output of the memory 20 is applied to a window comparator 23 which has positive and negative reference levels $e_1$ and $e_2$ (shown in FIG. 4D) from a variable level setting circuit 24. Those portions of the difference signal which exceed the reference levels $e_1$ and $e_2$, are delivered from the window comparator 23 in the form of normalized rectangular wave signals having levels "1" and "−1", as shown in FIG. 4F, and the normalized rectangular wave signals are applied to a gate circuit 25. It is known from the comparison between FIGS. 4A and 4F that the polarity of the rectangular pulses contained the rectangular wave signals indicates whether the scanned surface slopes upward or downward when viewed from the detectors 5a and 5b, and the width of each of the above pulses indicates a gradient (namely, an incline) of a sloped part of the scanned surface. Next, explanation will be made of a method of detecting the width of each rectangular pulse. The gate circuit 25 is kept at the open-state only for a period during which a rectangular pulse shown in FIG. 4F is applied to the gate circuit 25, to pass the clock pulses from the clock pulse generator 21 as shown in FIG. 4G. The clock pulses having passed through the gate circuit 25 are counted by an up/down pulse counter 26 which performs positive or negative counting, depending upon whether the output of the window comparator 23 is the positive rectangular wave signal or the negative rectangular wave signal. The number of clock pulses thus counted and the sign thereof are written in a memory 27 which is addressed by the output of a pulse counter 28 for counting the falling edges of rectangular pulses contained in the rectangular wave signals (as shown in FIGS. 4G and 4H). Thereafter, the up/down pulse counter 26 is reset by the above falling edges of the rectangular pulses. The above operation is repeated for a period in which the electron beam 2 scans a single line. Thus, the waveform of the difference signal and information on the unevenness of the scanned surface are stored in the memories 20 and 27, respectively. In the present embodiment, the difference signal is written in the memory 20. Alternatively, the window comparator 23 may be connected between the difference amplifier 12 and memory 20, to write the normalized rectangular wave signals in the memory 20.

Next, explanation will be made of the readout operation of the signal processing unit 13, that is, a method of reconstructing the uneven structure of the scanned surface. Similarly to the write-in operation, the difference signal from the waveform memory 20 is converted into the normalized rectangular wave signals, and the gate circuit 25 is put in the open-state by each of rectangular pulses contained in the rectangular pulse signals, to count the clock pulses by the up-down pulse counter 26. In the read-out operation, however, the up-down pulse counter 26 performs only positive counting, on the basis of a command from the control unit 11. The count of the counter 26 is applied to a multiplier 30, to be multiplied by the output of a divider 29 which produces the reciprocal of a gradient value (namely, an incline value) stored in the memory 27 which is addressed by the pulse counter 28. The output of the multiplier 30 is added to the output of the holding circuit 31 by an adder 32. In the present case, a given value may be used as the initial data of the holding circuit 31. However, in oblique mapping (namely, in a case where a bird's-eye view is formed), a specified value is used as the initial data of the holding circuit 31, as will be mentioned later.

Figure 4I:
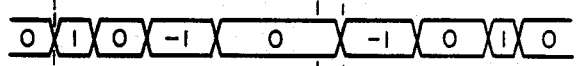
Figure 4J:
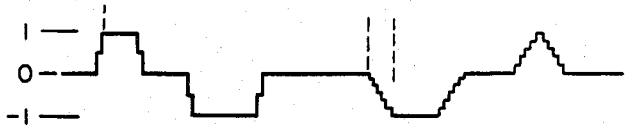

The above multiplying and adding operations are performed using the same incline value, during a period when the gate circuit 25 is kept at the openstate and the count of the pulse counter 26 increases continuously. The output of the multiplier 30 is given to the holding circuit 31 at a time the gate circuit 25 is closed to terminate the clock pulse counting operation (as shown in FIG. 4I). At the same time, the count of the counter 28 is incremented by one, to read out the next incline value. Such a series of operations is repeated in synchronism with clock pulses from the clock pulse generator 21, and the output of the adder 32 is converted by a digital-to-analog converter 33 into an analog signal, which shows the unevenness of the scanned surface as shown in FIG. 4J and is used as the vertical deflection signal of the monitor 8, to observe the uneven structure of scanned surface.

In the foregoing, explanation has been made of the display of uneven structure in the line scanning passing through a given point on a surface to be measured (for example, the line scanning in an X-direction having a constant Y-coordinate). Now, the display of three-dimensional structure of the surface (that is, the display of a bird's-eye view of the sample surface) in a case where the surface is scanned two-dimensionally by the primary beam, will be briefly explained below. In order to determine initial values for a large number of scanning operations in X-directions, a scanning operation in a Y-direction having an X-coordinate equal to zero is performed, and unevenness data along the Y-direction is stored in a different memory (not shown) in a manner similar to the above-mentioned. When the unevenness of surface along an X-direction is displayed, a value which is obtained by the scanning operation in the Y-direction and corresponds to the X-direction, is used as the initial data of the holding circuit 31. Thus, the three dimensional configuration of the two-dimensionally scanned surface can be displayed on the monitor 8.

Although the present embodiment uses a scanning electron microscope, the present invention is not limited to such a case, but is applicable to various charged particle beam microprobe apparatuses in which a sample is scanned with an electron or ion beam. Further, the digital data indicating the unevenness of the scanned surface may be applied directly to the control unit 11 without being converted into analog data, to be displayed by a plotter.

As has been explained in the foregoing, according to the present invention, the three-dimensional configuration of a scanned surface is determined from a two-dimensional image signal of the scanned surface, and a novel method for displaying a bird's-eye view of the scanned surface is provided. Thus, the application field of a scanning electron microscope or the like is widened by the present invention. Further, small dimensions on the scanned surface can be measured from a two-dimensional image thereof, by utilizing the three-dimensional configuration determined by the present invention. Specifically, in the case where small dimensions on a scanned surface is automatically measured, the determination of three-dimensional configuration by the present invention is very important, since human judgment based upon the visual observation of scanned image is omitted.

We claim:

1. A charged particle beam microprobe apparatus comprising:

means for scanning a sample with a charged particle beam;

detection means including a pair of detectors for detecting image signals, said detectors being disposed symmetrically with respect to the optical axis of said charged particle beam;

means for producing a difference signal between said image signals detected in a scanning operation for said sample; and signal processing means responsive to said difference signal for producing a signal which directly represents the configuration of the scanned surface of said sample including any upward or downward sloping areas thereof when viewed from said detection means as well as the gradient said sloping areas of said scanned surface, on the basis of said difference signal, to determine the topography of said scanned surface, said signal processing means including a signal normalizing circuit for comparing said difference signal with reference levels to deliver positive and negative rectangular wave signals, an incline extracting circuit for obtaining information on whether said scanned surface slopes upward or downward when viewed from said detection means and information on the incline of said scanned surface from the polarity and pulse width of each rectangular wave signal, respectively, and a shape reforming circuit for reconstructing the uneven structure of said scanned surface, on the basis of the output signal of said incline extraction circuit.

2. A charged particle beam microprobe apparatus according to claim 1, further comprising display means responsive to the signal produced by said signal processing means for producing a visual display of the detailed configuration of the topography of said scanned surface.

* * * * *